(12) United States Patent
Takahashi

(10) Patent No.: US 9,543,967 B2
(45) Date of Patent: Jan. 10, 2017

(54) DLL CIRCUIT AND SEMICONDUCTOR DEVICE

(71) Applicant: PS4 Luxco S.a.r.l., Luxembourg (LU)

(72) Inventor: Hiroki Takahashi, Tokyo (JP)

(73) Assignee: LONGITUDE SEMICONDUCTOR S.A.R.L., Luxembourg (LU)

( * ) Notice: Subject to any disclaimer, the term of this patent is extended or adjusted under 35 U.S.C. 154(b) by 0 days.

(21) Appl. No.: 14/762,532

(22) PCT Filed: Jan. 28, 2014

(86) PCT No.: PCT/JP2014/051810
§ 371 (c)(1),
(2) Date: Jul. 22, 2015

(87) PCT Pub. No.: WO2014/119558
PCT Pub. Date: Aug. 7, 2014

(65) Prior Publication Data
US 2015/0372683 A1    Dec. 24, 2015

(30) Foreign Application Priority Data
Jan. 29, 2013   (JP) .................................. 2013-014453

(51) Int. Cl.
*H03L 7/08*      (2006.01)
*G11C 11/4076*   (2006.01)
(Continued)

(52) U.S. Cl.
CPC ................ *H03L 7/08* (2013.01); *G11C 7/222* (2013.01); *G11C 11/4076* (2013.01);
(Continued)

(58) Field of Classification Search
CPC ....................................................... H03L 7/08
See application file for complete search history.

(56) References Cited

U.S. PATENT DOCUMENTS 6,642,762 B2   11/2003   von Kaenel
6,826,247 B1   11/2004   Elliott et al.
(Continued)

OTHER PUBLICATIONS

Application No. PCT/JP2014/051810, International Search Report, Apr. 1, 2014.

*Primary Examiner* — Hai L Nguyen
(74) *Attorney, Agent, or Firm* — Kunzler Law Group, PC

(57) ABSTRACT

In accordance with disclosed embodiments, a DLL circuit includes a variable frequency division circuit that uses a variable frequency division ratio to frequency-divide a first clock signal to generate first and second frequency-divided clock signals, a grain size change circuit that changes the count width in synchronization with the first frequency-divided clock signal, a counter circuit that updates the count value in accordance with the count width in synchronization with the second frequency-divided clock signal, and a variable delay circuit that delays the first clock signal on the basis of a delay amount that is in accordance with the count value, thereby generating a second clock signal. When the relationship in magnitude between the phase difference between the first and second clock signals and a predetermined value becomes inverse just after the updating of the count value, the grain size change circuit changes the count width, and the variable frequency division circuit sets the frequency division ratio of the second frequency-divided clock signal being greater than that of the first frequency-divided clock signal.

15 Claims, 8 Drawing Sheets

(51) Int. Cl.
*G11C 7/22* (2006.01)
*H03L 7/081* (2006.01)

(52) U.S. Cl.
CPC .......... *H03L 7/0812* (2013.01); *H03L 7/0814* (2013.01); *H03L 7/0816* (2013.01)

(56) References Cited

U.S. PATENT DOCUMENTS

| | | |
|---|---|---|
| 7,366,270 B2 | 4/2008 | Tang et al. |
| 7,403,054 B1 | 7/2008 | Malladi et al. |
| 7,746,134 B1 | 6/2010 | Lu et al. |
| 8,085,073 B2 * | 12/2011 | Lee .......... H03L 7/087 327/149 |
| 8,749,281 B2 * | 6/2014 | Seo .......... H03L 7/0812 327/147 |
| 2010/0213991 A1 | 8/2010 | Fukuda |
| 2011/0204942 A1 | 8/2011 | Abe et al. |

* cited by examiner

FIG. 8

| Maximum Count 2048 (= 2^11) | Count Width (Granularity) | 64 | 16 | 4 | 1 |
| --- | --- | --- | --- | --- | --- |
| | Count Update Frequency | 32 | 4 | 4 | 4 |

| Overall Count Update Frequency | Count Width Update Frequency | tCR (Number of Periods) |
| --- | --- | --- |
| 44 | 3 | 2 |

| | Division Ratio | Number of Lock Periods |
| --- | --- | --- |
| Study Example 1 | 10 | 440 |
| Study Example 2 | 8 | 376 |
| Embodiment 1 | 8 | 358 |

DLL CIRCUIT AND SEMICONDUCTOR DEVICE

DESCRIPTION OF RELATED APPLICATION

The present invention is based on the priority claim of Japanese Patent Application No. 2013-014453 (filed on 29 Jan. 2013), and the contents of the same application are incorporated in their entirety herein by reference.

TECHNICAL FIELD

The present invention relates to a delay locked loop (DLL) circuit and to a semiconductor device. In other words, it is related, for example, to a DLL circuit incorporated into a semiconductor memory device and to a semiconductor memory device incorporating the DLL circuit.

BACKGROUND ART

In recent years, the main memory widely used in personal computers, and the like, has been synchronous memory which performed operations synchronized with clock signals. In particular, double data rate (DDR) synchronous memory requires that input/output data be accurately synchronized with external clock signals, and thus requires a delay locked loop (DLL) circuit to generate internal clock signals that are synchronized with external clock signals.

In one example, Patent Document 1 describes dynamic random access memory (DRAM) including a DLL circuit. The DRAM described in Patent Document 1 controls the output of data read from memory cells and the self-refresh timing of memory cells, etc., on the basis of internal clock signals generated by the DLL circuit.

Patent Document 2 describes a DLL circuit used in a semiconductor memory device. The DLL circuit described in Patent Document 2 has a coarse delay line (CDL) with a coarsely adjusted pitch and a fine delay line (FDL) with a finely adjusted pitch. After the amount of delay has been roughly set using the coarse delay line (CDL), the amount of delay is set more accurately using the fine delay line (FDL). In this way, the amount of delay can be determined very quickly.

Patent Document 3 describes a DLL circuit comprising a clock generating circuit for dividing external clock signals and generating operating clock signals based on the divided clock signals, a counter circuit synchronized with the generated operating clock signals for updating a count value, and a delay line for delaying the external clock signals on the basis of the amount of delay determined by the count value and generating internal clock signals.

Patent Document 4 describes a DLL circuit comprising a variable delay circuit for generating internal clock signals by delaying external clock signals, and a dividing circuit for dividing the external clock signals to generate sampling clock signals, the resulting sampling clock signals being used as synchronization signals indicating the timing on which the amount of delay is changed by the variable delay circuit.

PATENT DOCUMENTS

Patent Document 1: JP 2012-129630 A
Patent Document 2: JP 2009-021706 A
Patent Document 3: JP 2010-226173 A
Patent Document 4: JP 2011-009922 A

SUMMARY OF THE INVENTION

Problem to be Solved by the Invention

The contents of these patent documents are incorporated in their entirety herein by reference. The following analysis was conducted by the present inventor. Prior to arriving at the ideas in the present invention, the present inventor studied two DLL circuits (in Study Example 1 and Study Example 2 below), and considered the problems with these DLL circuits.

Study Example 1

The following is a description of the DLL circuit in the first study example (Study Example 1) with reference to the drawings. FIG. 1 is a block diagram showing the configuration of the digital control-type DLL in Study Example 1. As shown in FIG. 1, the DLL circuit includes a granularity changing circuit 116, a control circuit 117, a counter circuit 118, a decoder circuit 119, a variable delay circuit 122, a phase determining circuit 124, a divider circuit 126, and a detection circuit 128.

The DLL circuit shown in FIG. 1 delays the input clock signals CK by the desired phase (target phase) to generate output clock signals CKOUT.

The divider circuit 126 divides the input clock signals CK to generate divided clock signals CK1-CK3 with different phases. Divided clock signal CK1 has a phase in advance of divided clock signal CK2, and divided clock signal CK2 has a phase in advance of divided clock signal CK3. The division ratio for the divided clock signals is determined by the feedback delay of the DLL circuit. For example, at DDR3 (Double Data Rate 3), a division ratio of 10 or more is used.

The counter circuit 118 generates a count value for determining the amount of delay used for the signals by the variable delay circuit 122, and a count signal CNT indicating the count value is outputted to the decoder circuit 119.

The decoder circuit 119 decodes the count signal CNT received from the counter circuit 118 and outputs the decoded signal to the variable delay circuit 122.

The variable delay circuit 122 generates output clock signals CKOUT obtained by delaying the input clock signals CK in response to the amount of delay determined in response to the count signal CNT, and outputs the resulting clock signals.

The phase determining circuit 124 determines whether or not the phase difference between the input clock signals CK and the output clock signals CKOUT is greater than the desired target phase, and the determination result is outputted to the control circuit 117 as the phase determining signals.

The control circuit 117 synchronized with divided clock signals CK1 references the phase determining signals, and generates an up/down signal UPDN indicating whether or not the phase difference between the input clock signals CK and the output clock signals CKOUT is greater than the desired target phase. When the phase difference between the input clock signals CK and the output clock signals CKOUT is greater than the desired target phase, the control circuit 117 outputs a low-level up/down signal UPDN. When the phase difference between the input clock signals CK and the output clock signals CKOUT is less than the desired target phase, a high-level up/down signal UPDN is outputted.

Before and after the counter circuit 118 changes the count value (that is, before and after the variable delay circuit 122 changes the amount of delay), the detection circuit 128 detects whether or not the level of the up/down signals UPDN outputted by the control circuit 117 has been changed between the low level and the high level. When the level of the up/down signal UPDN changes before and after a count value change, the detection circuit 128 outputs a high-level target edge detection circuit TE. Otherwise, it outputs a low-level target edge detection signal TE.

The granularity changing circuit 116 synchronized with divided clock signals CK2 references the target edge detection signal TE. When the target edge detection signal TE is at a high level, the counter circuit 118 changes the width (also called granularity or count width) at which the count value is incremented or decremented from large to small, and outputs a granularity indicating signal indicating the count width.

The counter circuit 118 synchronized with divided clock signals CK3 references the up/down signal UPDN and the granularity indicating signal. When the up/down signal UPDN is at the high level, the count value is incremented by the count width (granularity) indicated by the granularity indicating signal. Meanwhile, when the up/down signal UPDN is at the low level, the count value is decremented by the count width indicated by the granularity indicating signal.

It should be noted that in the present specification, the width by which the count value is changed when the count value determined by the amount of delay from the variable delay circuit is incremented or decremented is referred to as the count width (or granularity). When the count width of the count value is large, the granularity is said to be coarse. When the count width of the count value is small, the granularity is said to be fine. In other words, when the granularity is coarse, a coarse adjustment is made to the amount of delay by the variable delay circuit 122 and, when the granularity is fine, a fine adjustment is made to the amount of delay by the variable delay circuit 122.

FIG. 2 is a timing chart showing, as an example, the operations of the DLL circuit (FIG. 1) in the present study example. In the example shown in FIG. 2, the division ratio for the divided clock signals CK1-CK3 is 5.

The control circuit 117 is synchronized with the rising edge of time t1 for divided clock signal CK1, references the phase determining signals outputted by the phase determining circuit 124, and outputs a low-level up/down signal UPDN because the output phase of the DLL circuit (that is, the phase difference between the input clock signals CK and the output clock signals CKOUT) is greater than the target phase.

At time t1, the detection circuit 128 detects the change in the up/down signal UPDN outputted by the control circuit 117 before and after the counter circuit 118 changes the count value, and outputs a high-level target edge detection signal TE.

The granularity changing circuit 116 is synchronized with the rising edge of time t2 for divided clock signal CK2, references the target edge detection signal TE outputted by the detection circuit 128, changes the count width of the counter circuit 118 from 16 to 4 because the target edge detection signal TE is a high-level signal, and outputs a granularity indicating signal indicating a count width before and after the change of 4.

The counter circuit 118 is synchronized with the rising edge of time t3 of divided clock signal CK3, and references the up/down signal UPDN and the granularity indicating signal. Because the up/down signal UPDN is a low-level signal and the granularity indicating signal indicates a count width of 4, the counter circuit 118 decrements the count value by a count width of 4.

Thus, the lock operation of the DLL circuit can be performed at high speed by changing the count width (granularity) of the counter circuit 118 from a large value to a small value. In Study Example 1, the granularity changing circuit 116 is synchronized with divided clock signal CK2 having a phase in advance of divided clock signal CK3, and the granularity is changed each time the target edge is detected. Finally, the DLL circuit is moved into the locked state by adjusting the phase to smallest granularity.

In the example shown in FIG. 2, the locked state is entered in a period corresponding to five periods of the divided clock signal. In Study Example 1, the time elapsing before the locked state is entered (lock time) corresponds to 25 periods of the input clock signal CK because the division ratio for the divided clock signals is 5.

When the granularity of the count value of the counter circuit 118 is changed each time the target edge is detected as in Study Example 1, a setup time (count width changing time) tCR is required from the change in the count width (granularity) to the update in the count value. In the example shown in FIG. 1, the update in the count value for the counter circuit 118 (increment or decrement) has to be performed on the basis of the granularity indicating signal determined by divided clock signal CK2. Therefore, the count value is updated using divided clock signal CK3 having a phase behind that of divided clock signal CK2. Because divided clock signals CK1, CK2 and CK3 are generated in sync with the input clock signal CK, each has a phase difference which is an integral multiple of the input clock signal CLK. Therefore, the setup time tCR requires a single period at a minimum. In order to ensure the setup time tCR, in Study Example 1, the division ratio for the divided clock signals used in the control process is a division ratio obtained by adding setup time tCR (division ratio 5 in FIG. 2).

Study Example 2

The following is a description of the DLL circuit in the second study example (Study Example 2) with reference to the drawings. FIG. 3 is a block diagram showing the configuration of the digital control-type DLL circuit in Study Example 2.

In Study Example 2, the counter circuit 118 uses divided clock signals CK2 to increment or decrement the count value. In the DLL circuit from Study Example 1 (FIG. 1), a setup time tCR had to be inserted between each division period in order to change the count value using divided clock signals CK3. However, the DLL circuit in Study Example 2 does not require the insertion of a setup time tCR between division periods, and the division periods can be one period shorter than the DLL circuit in Study Example 1 (that is, the division ratio for the divided clock signals is reduced by 1).

FIG. 4 is a timing chart showing, as an example, the operations of the DLL circuit (FIG. 3) in Study Example 2. In the example shown in FIG. 4, the division ratio for the divided clock signals CK1-CK3 is 4.

The control circuit 117 is synchronized with the rising edge of time t1 of divided clock signal CK1, references the phase determining signal outputted by the phase determining circuit 124, and outputs a low-level up/down signal UPDN because the phase outputted by the DLL circuit is greater than the target phase.

At time t1, the detection circuit 128 detects the change in the up/down signal UPDN outputted by the control circuit 117 before and after the counter circuit 118 changes the count value, and outputs a high-level target edge detection signal TE.

The granularity changing circuit 116 is synchronized with the rising edge of time t2 for divided clock signal CK2, references the target edge detection signal TE outputted by the detection circuit 128, changes to the count width of the counter circuit 118 from 16 to 4 when the count value has been updated because the target edge detection signal TE is a high-level signal, and outputs a granularity indicating signal indicating a count width before and after the change of 4.

The counter circuit 118 is synchronized with the rising edge of time t2 of divided clock signal CK2, and references the up/down signal UPDN and the granularity indicating circuit. Because the up/down signal UPDN is a low-level signal and the granularity indicating signal indicates a count width of 16, the counter circuit 118 decrements the count value by a count width of 16. In Study Example 2, because the change in the count width and the update of the count value are synchronized with the same divided clock signal CK2, the change in the count width is not reflected in the update of the count value at time t2.

Next, the control circuit 117 is synchronized with the rising edge of time t5 of divided clock signal CK1, references the phase determining signal outputted by the phase determining circuit 124, and outputs a high-level up/down signal UPDN because the phase outputted by the DLL circuit is smaller than the target phase.

At time t5, the detection circuit 128 detects the change in the up/down signal UPDN outputted by the control circuit 117 before and after the counter circuit 118 changes the count value, and outputs a high-level target edge detection signal TE.

The granularity changing circuit 116 is synchronized with the rising edge of time t6 of divided clock signal CK2, and references the target edge detection signal TE outputted from the detection signal 128. Even though the target edge detection signal TE is a high-level signal, the granularity changing circuit 116 does not change the count width because the period until the change in the count width is reflected in the update of the count value (that is, the period corresponding to a single period of the divided clock signal) has not elapsed since the previous count width was changed. Therefore, the granularity changing circuit 116 outputs a granularity indicating signal indicating a count width of 4.

The counter circuit 118 is synchronized with the rising edge of time t6 of divided clock signal CK2, and references the up/down signal and the granularity indicating signal. Because the up/down signal UPDN is a high-level signal and the granularity indicating signal indicates a count width of 4, the counter circuit 118 increments the count value by a count width of 4.

In the example shown in FIG. 4, the locked state is entered in a period corresponding to eight periods of the divided clock signal. In Study Example 2, the time elapsing before the locked state is entered (lock time) corresponds to 32 periods of the input clock signal CK because the division ratio for the divided clock signals is 4.

In the DLL circuit of Study Example 2, a granularity change standby time tCR of one divided period occurs when the granularity changes. In other words, while the division ratio for the divided clock signals in the DLL clock of Study Example 2 is smaller than the division ratio for the divided clock signals in the DLL circuit of Study Example 1 (FIG. 1), a setup time tCR corresponding to a single divided period occurs each time the granularity is changed.

As shown above, there is the problem, in the case of both the DLL circuit of Study Example 1 and the DLL circuit of Study Example 2, that the time prior to entry of the DLL circuit into the locked state is lengthy.

Means for Solving the Problem

According to a first mode of embodiment, a delay locked loop (DLL) circuit comprises:
a variable divider circuit for generating a first divided clock signal and a second divided clock signal by dividing a first clock signal using a variable division ratio;
a granularity changing circuit synchronized with the first divided clock signal for changing the count width;
a counter circuit synchronized with the second divided clock signal for updating the count value in response to the count width; and
a variable delay circuit for delaying the first clock signal on the basis of the amount of delay in response to the count value to generate a second clock signal;
the granularity changing circuit changing the count width and the variable divider circuit establishing a division ratio for the second divided clock signal greater than the division ratio for the first divided clock signal when the size relationship between the phase difference of the first clock signal and the second clock signal and a predetermined value has been reversed before and after an update of the count value.

Effect of the Invention

A DLL circuit of the first mode of embodiment is able to adjust the change width for the amount of delay and is able to enter the locked state in a short period of time.

BRIEF DESCRIPTION OF THE DRAWINGS

FIG. 8 is a table showing the performance of the DLL circuits in Study Example 1 and Study Example 2, and the performance of DLL circuit according to the first embodiment of the present invention.

EMBODIMENT OF THE INVENTION

Figure 1:
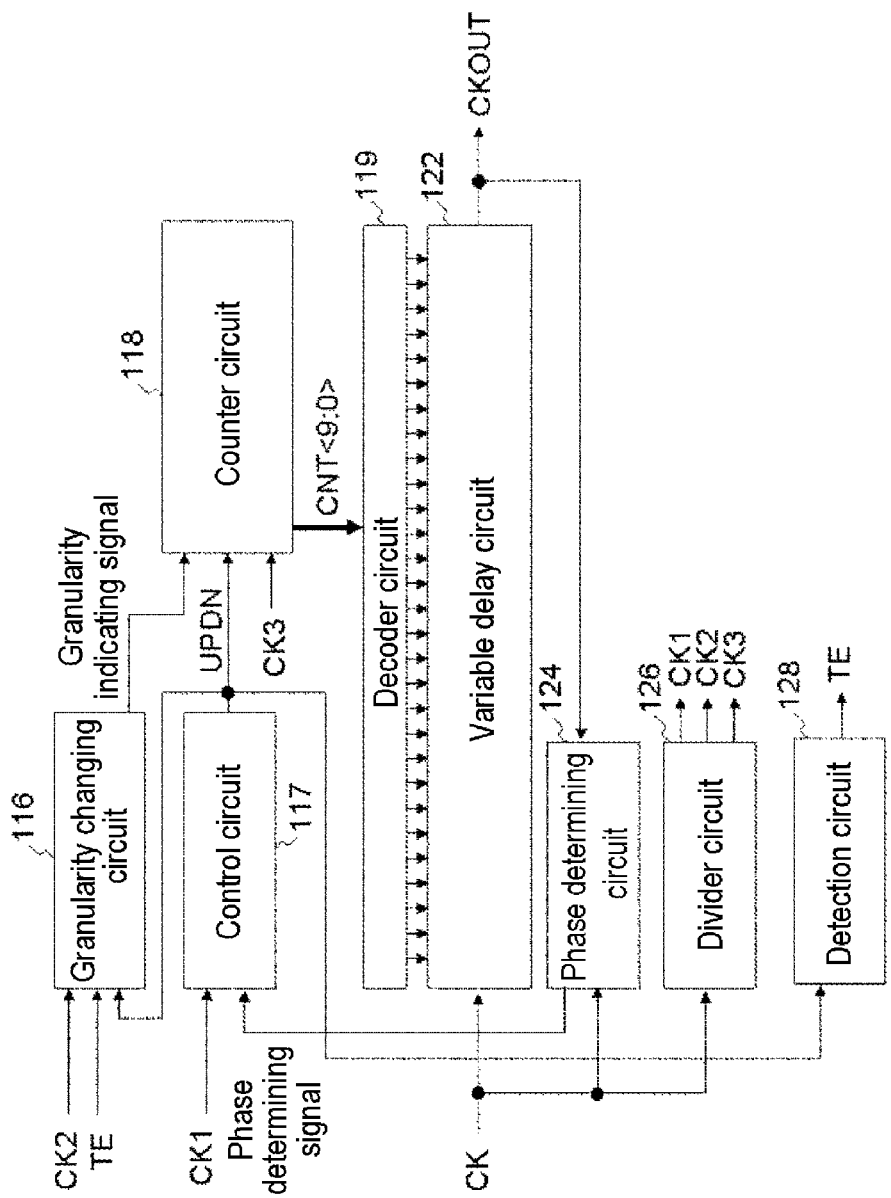
FIG. 1 is a block diagram showing, as an example, the configuration of the DLL circuit in Study Example 1.
Figure 2:
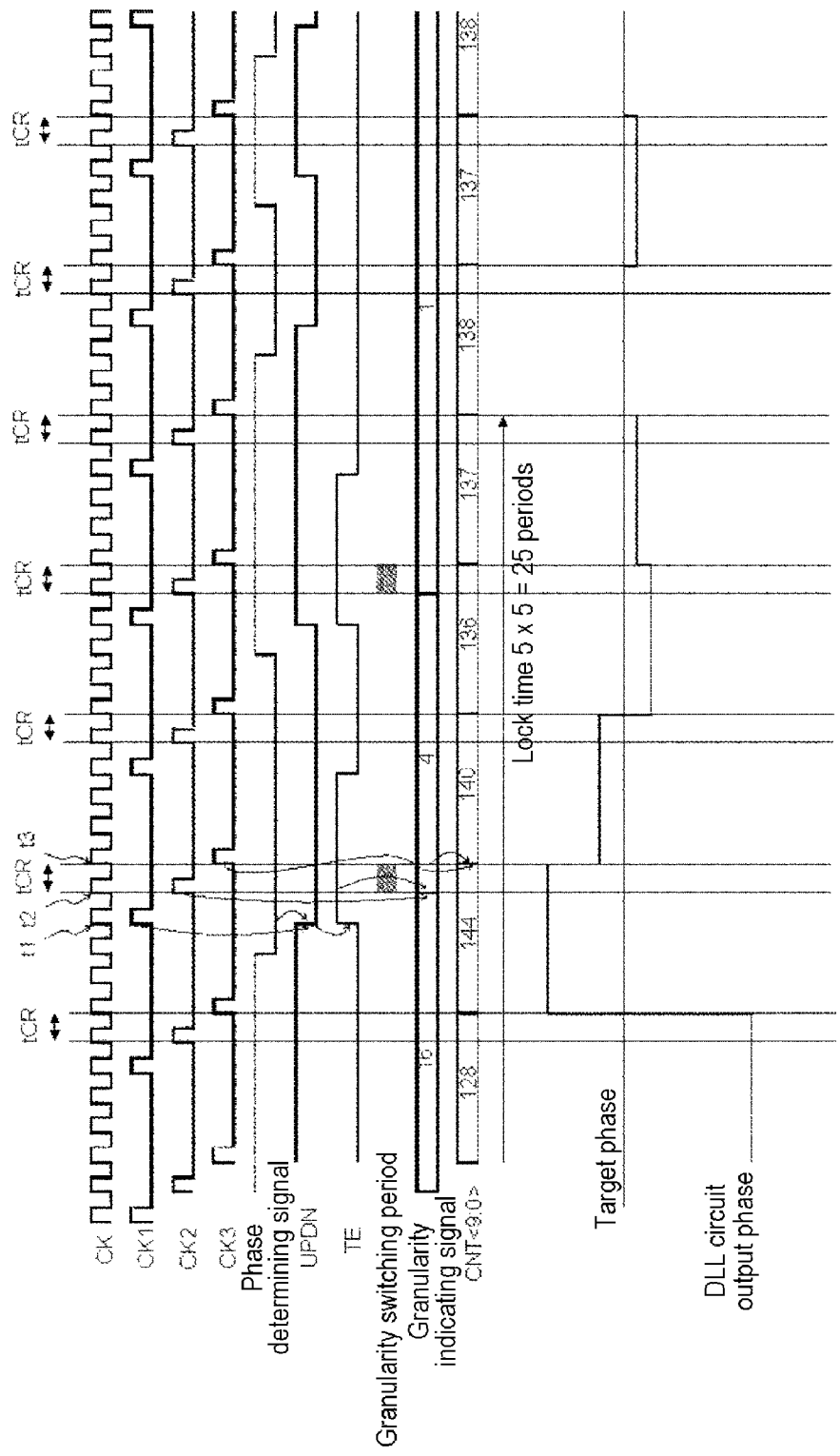
FIG. 2 is a timing chart showing, as an example, the operations of the DLL circuit in Study Example 1.

First, an overview of the present invention will be provided. The reference numbers in the drawings cited in this overview are for explanatory purposes only. The present invention should not be construed to be limited in any way to the illustrated embodiment.

Figure 6:
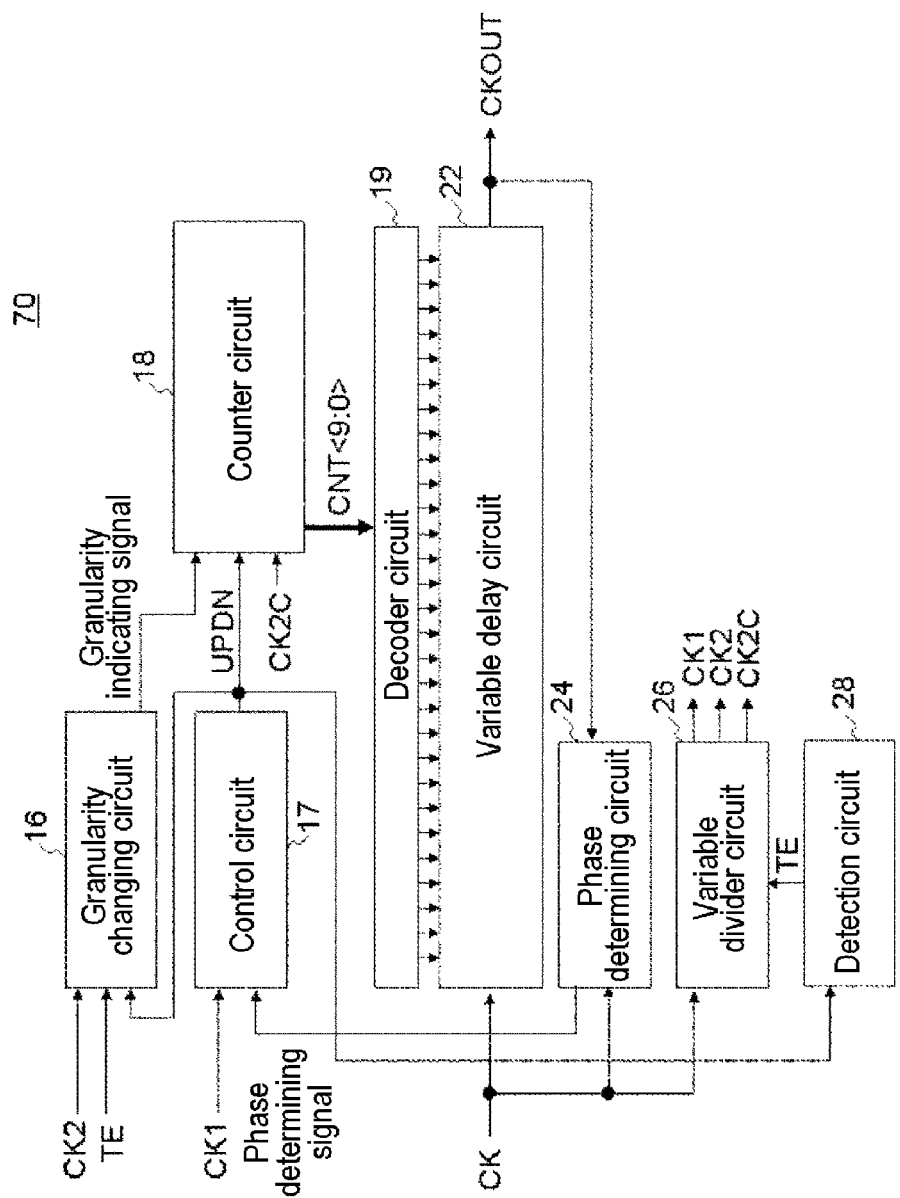
FIG. 6 is a block diagram showing, as an example, the configuration of the DLL circuit according to the first embodiment of the present invention.

FIG. 6 is a block diagram showing, as an example, the configuration of a delay locked loop (DLL) circuit according to the present invention. In FIG. 6, the DLL circuit (70) comprises: a variable divider circuit (26) for generating a first divided clock signal (CK2) and a second divided clock signal (CK2C) by dividing a first clock signal (input clock signal CK) using a variable division ratio; a granularity changing circuit (16) synchronized with the first divided clock signal (CK2) for changing the count width (increment width or decrement width for the count value); a counter circuit (18) synchronized with the second divided clock signal (CK2C) for updating the count value in response to the count width; and a variable delay circuit (22) for delaying the first clock signal (CK) on the basis of the amount of delay in response to the count value to generate a second clock signal (output clock signal CKOUT).

Figure 7:
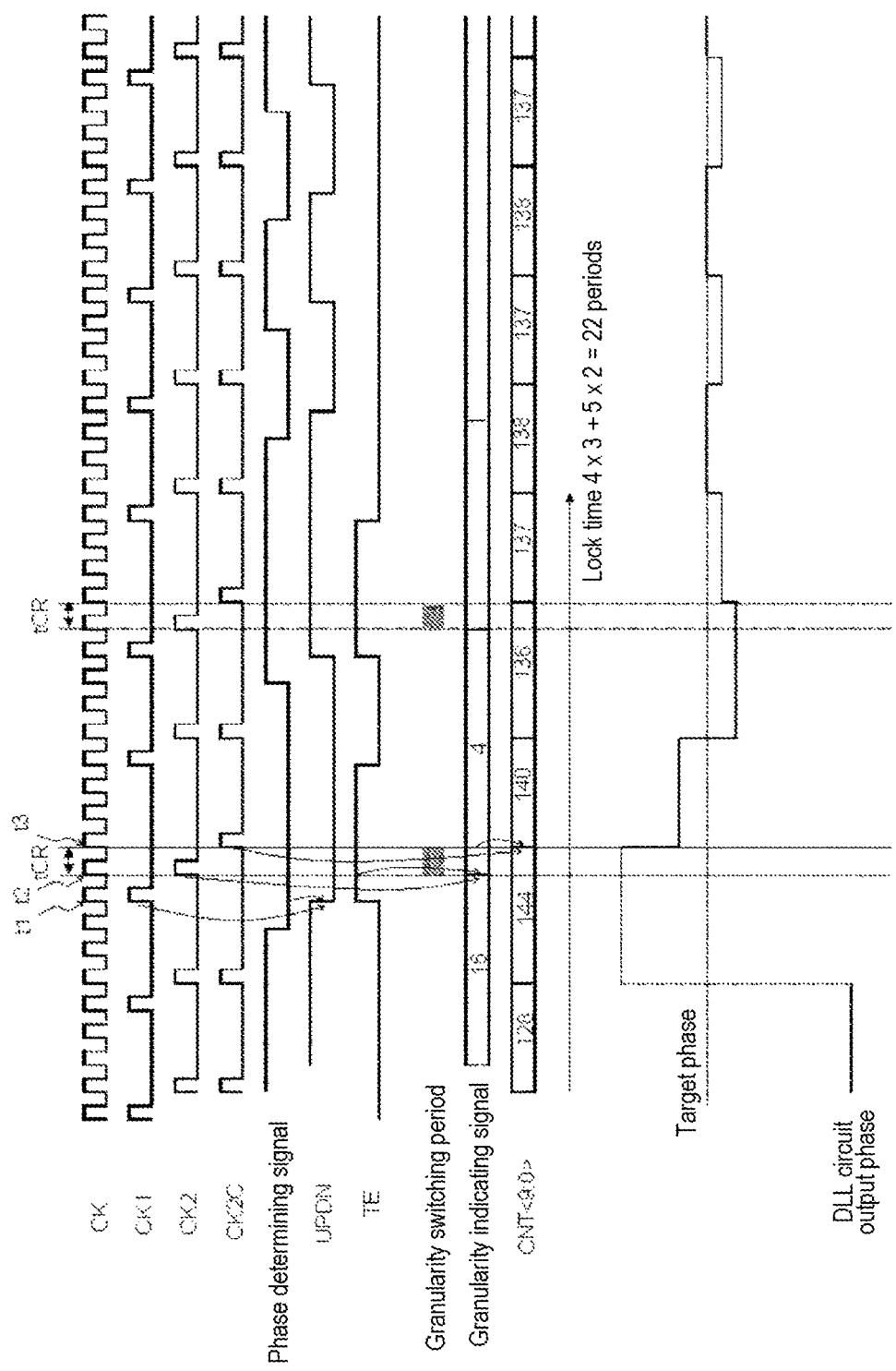
FIG. 7 is a timing chart showing, as an example, the operations of the DLL circuit according to the first embodiment of the present invention.

FIG. 7 is a timing chart showing, as an example, the operations of the DLL circuit (70). Referring to FIG. 7, the granularity changing circuit (16) changes the count width, and the variable divider circuit (26) establishes a division ratio for the second divided clock signal (CK2C) that is greater than the division ratio for the first divided clock signal (CK2) when the size relationship between the phase difference (DLL circuit output phase) of the first clock signal (CK) and the second clock signal (CKOUT) and a predetermined value (the target phase) has been reversed before and after an update of the count value.

In FIG. 7, as an example, the granularity changing circuit (16) changes the count width from 16 to 4 and from 4 to 1 when the size relationship has been reversed before and after an update of the count value. The variable divider circuit (26) has a division ratio for the second divided clock signal (CK2C) of 5, which is greater than the division ratio for the first divided clock signal (CK2) of 4.

Figure 3:
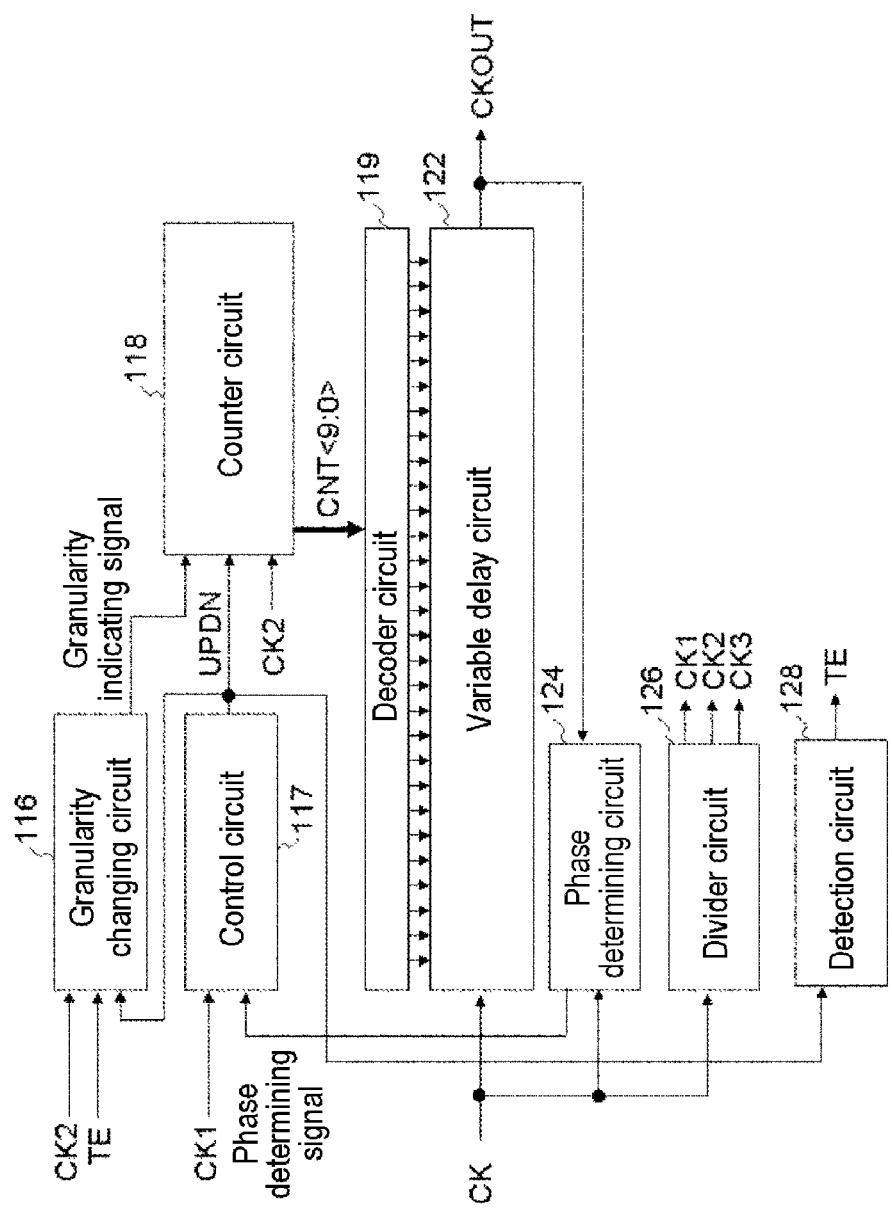
FIG. 3 is a block diagram showing, as an example, the configuration of the DLL circuit in Study Example 2.
Figure 4:
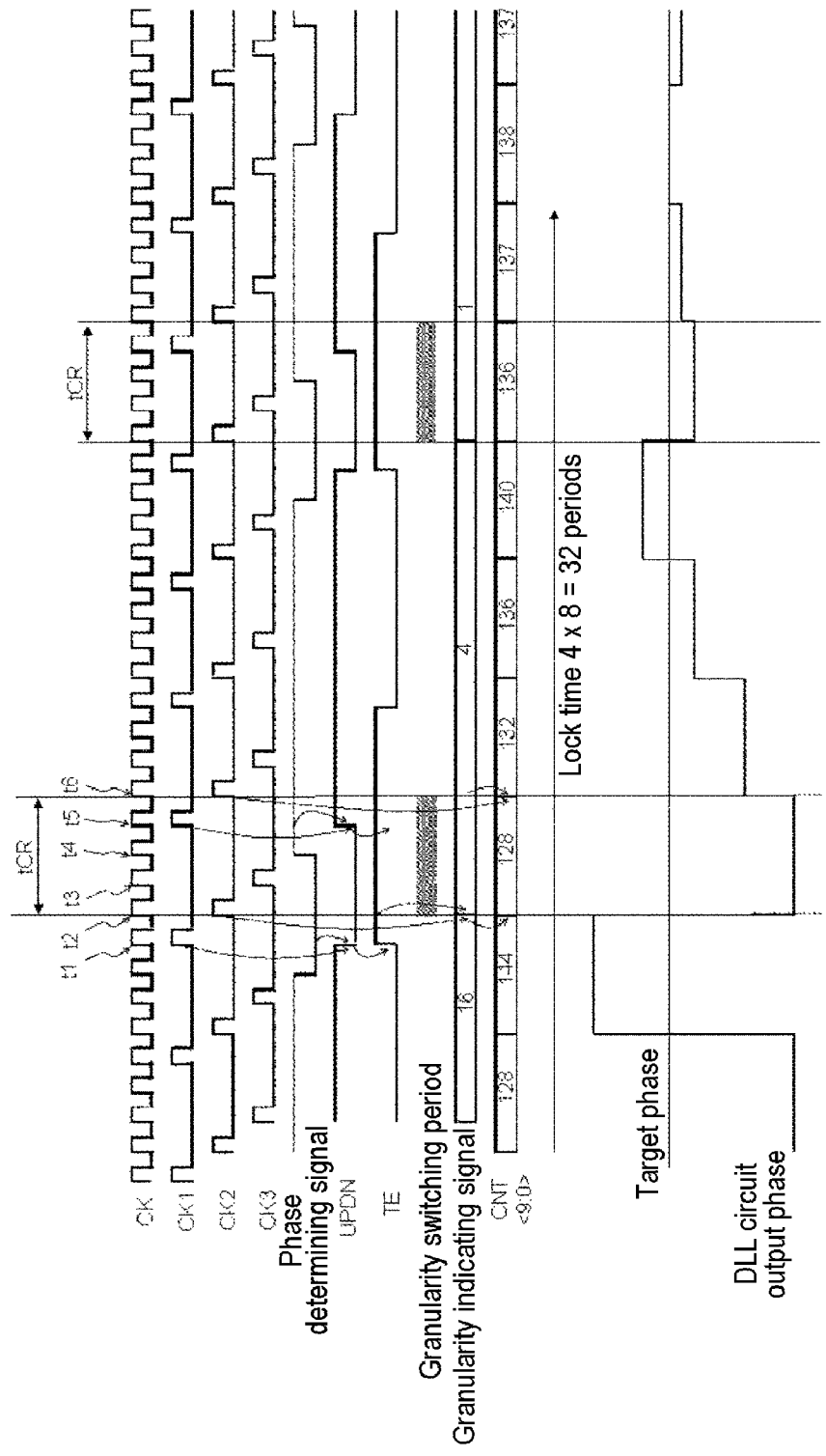
FIG. 4 is a timing chart showing, as an example, the operations of the DLL circuit in Study Example 2.

When the size relationship between the phase difference of the first clock signal (CK) and the second clock signal (CKOUT) and the predetermined value (target phase) has been reversed before and after an update of the count value, the DLL circuit (70) establishes a division ratio for the second divided clock signal (CK2C) which is greater than the division ratio for the first divided clock signal (CK2). At this time, when the count width is changed, the timing for the count value update can lag behind the timing for the count width change. Therefore, the DLL circuit (70) can reach the locked state in a shorter amount of time than the DLL circuits in Study Example 1 (FIG. 1) and Study Example 2 (FIG. 3). This is because the division ratio can be increased only when the count width is updated.

Also, after the division ratio for the second divided clock signal (CK2C) has been established so as to be larger than the division ratio of the first divided clock signal (CK2), the variable divider circuit (26) preferably increases the division ratio of the first divided clock signal (CK2) so as to be greater than the division ratio of the second divided clock signal (CK2C). In FIG. 7, as an example, in the divided clock period after the division ratio for the second divided clock signal (CK2C) has been set to 5 and the division ratio for the first divided clock signal (CK2) has been set to 4, the division ratio for the first divided clock signal (CK2) is set to 5, which is greater than the division ratio for the second divided clock signal (CK2C) of 4. In this way, the phase difference between the first divided clock signal (CK2) and the second divided clock signal (CK2C) can be eliminated.

Also, the variable divider circuit (26) generates a first divided clock signal (CK2) and a second divided clock signal (CK2C) without any phase difference by dividing the first clock signal (CK) using the same division ratio (a division ratio of 4 in FIG. 7). The division ratio of the second divided clock signal (CK2C) may be established so as to be greater than the division ratio of the first divided clock signal (CK2) in a divided clock period during which the size relationship has been reversed before and after a count value update, and the division ratio of the first divided clock signal (CK2) may be established so as to be greater than the division ratio of the second divided clock signal (CK2) in the divided clock period following this divided clock period.

Referring to FIG. 6 and FIG. 7, the variable divider circuit (26) preferably also generates a third divided clock signal (CK1) having a phase in advance of the first divided clock signal (CK2) and the second divided clock signal (CK2C) by dividing the first clock signal (CK) using the same division ratio.

In addition, the DLL circuit (70) may preferably further comprise a control circuit (17) which is synchronized with the third divided clock signal (CK1) for referencing the determination results of the phase determining circuit (24), and generating an up/down signal (UPDN) indicating the size relationship between the phase difference of the first clock signal (CK1) and the second clock signal (CKOUT) and a predetermined value (the target phase). When the up/down signal (UPDN) indicates that the phase difference is smaller than the predetermined value, the counter circuit (18) increments the count value by the count width. When the up/down signal (UPDN) indicates that the phase difference is greater than the predetermined value, the circuit counter (18) decrements the count value by the count width.

Referring to FIG. 7, the variable divider circuit (26) may establish the division ratio of the second divided clock signal (CK2C) so as to be greater than the division ratio of the first divided clock signal (CK2) and the third divided clock signal (CK1) in a divided clock period during which the size relationship has been reversed before and after a count value update, and then may establish the division ratio of the first divided clock signal (CK2) and the third divided clock signal (CK1) so as to be greater than the division ratio of the second divided clock signal (CK2C) in the divided clock period following this divided clock period.

Referring to FIG. 6, the DLL circuit (70) preferably includes a phase determining circuit (24) for determining whether or not the phase difference of the first clock signal (CK) and the second clock signal (CKOUT) is greater than the predetermined value. The DLL circuit (70) preferably also includes a detection circuit (28) for detecting a reversal in the size relationship between the phase difference and the predetermined value before and after a count value update by the counter circuit (18) on the basis of the determination results of the phase determining circuit (24), and for notifying the variable divider circuit (26) and the granularity changing circuit (16) of the detection results.

Figure 5:
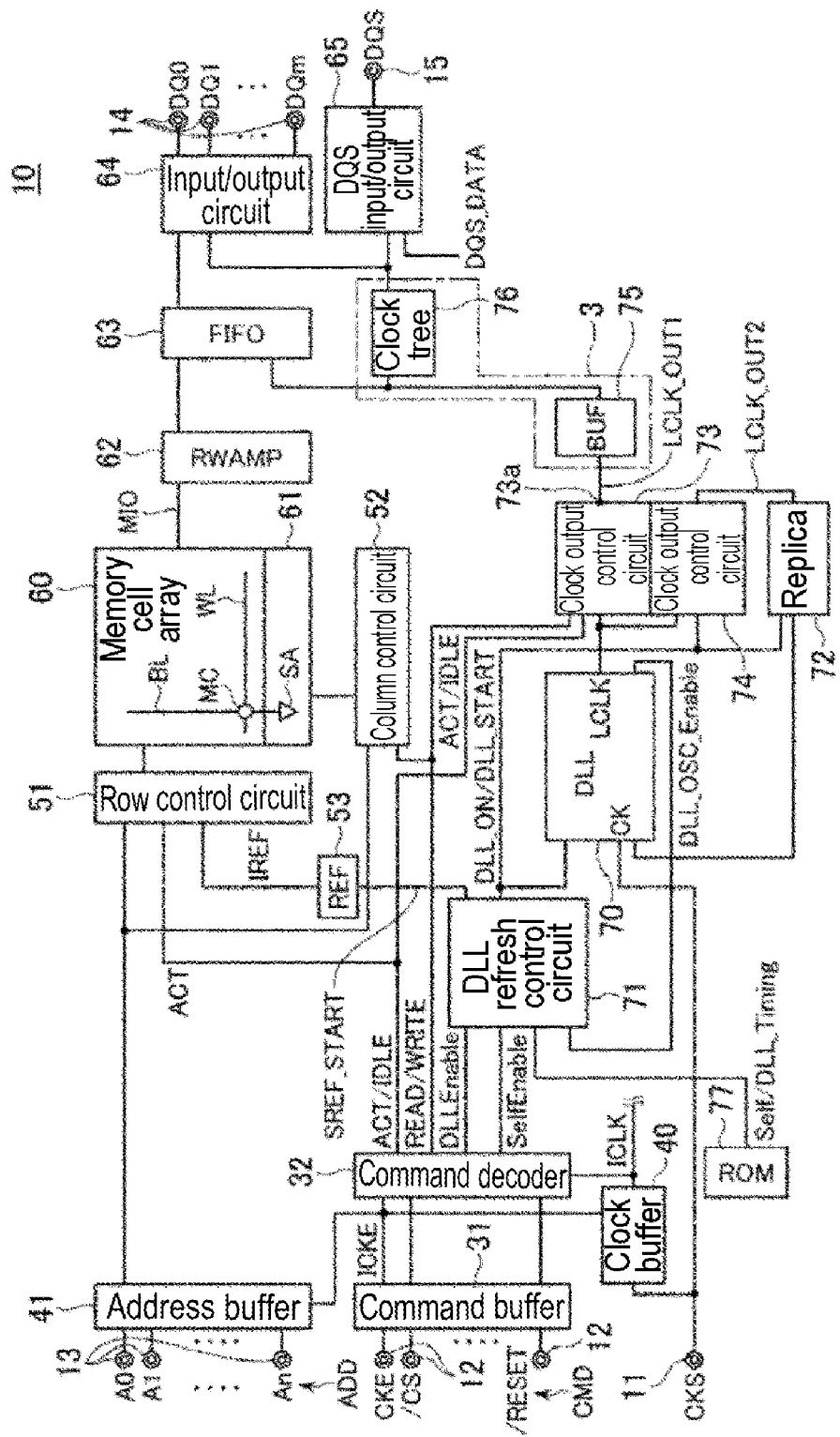
FIG. 5 is a block diagram showing, as an example, the configuration of a semiconductor device including a DLL circuit according to a first embodiment of the present invention.

FIG. 5 is a block diagram showing, as an example, the configuration of a semiconductor device (10) including this DLL circuit (70). Referring to FIG. 5, the semiconductor device (10) includes a DLL circuit (70) for receiving an external clock signal (CKS) as the first clock signal (CK) and for generating an internal clock signal (LCLK_OUT1) synchronized with the external clock signal (CKS) as the second clock signal (CKOUT), a memory cell (MC) for storing output data, and an output buffer (input/output circuit 64) synchronized with the internal clock signal (LCLK_

OUT1) for outputting the output data to an external unit. This semiconductor device (10) is able to realize high-speed reading operations.

Embodiment 1

The following is an explanation of the delay locked loop (DLL) circuit in a first embodiment of the present invention with reference to the drawings. First, the overall configuration of the semiconductor device (for example, a memory device such as DRAM) including the DLL circuit of the present embodiment will be explained.

FIG. 5 is a block diagram showing, as an example, the configuration of a semiconductor device including a DLL circuit according to the present embodiment. Referring to FIG. 5, the semiconductor device 10 is DDR-type synchronous dynamic random access memory (SDRAM) whose external terminals are a clock terminal 11, a command terminal 12, an address terminal 13, a data input/output terminal 14 (external data terminal), and a data strobe terminal 15.

An external clock signal CKS is supplied to the clock terminal 11. The supplied external clock signal CKS is supplied, in turn, to the clock buffer 40 and the DLL circuit 70. The clock buffer 40 generates a single-phase internal clock signal ICLK on the basis of the external clock signal CKS, and supplies the internal clock signal to the command decoder 32.

The DLL circuit 70 receives the internal clock signal CKS, subjects the external clock signal CKS to phase control, and generates a duty-controlled internal clock signal LCLK. The phase control adjusts the phase of the rising edge of the clock signal. The duty control adjusts the phase of the falling edge of the clock signal in order to maintain a 1:1 ratio (duty ratio) between the rising period and falling period in a single period of the clock signal. The generated internal clock signal LCLK is supplied to clock output control circuits 73, 74.

The DLL circuit 70 also has a function for determining whether or not the phase and duty ratio of the internal clock signal LCLK reach their respective target values (that is, whether they are locked), and a function for activating the oscillator startup signal DLL_OSC_Enable when it has been determined that they are locked. The oscillator startup signal DLL_OSC_Enable is supplied to the DLL refresh control circuit 71.

The DLL refresh control circuit 71 is described in greater detail below, but it is desirable for the DLL circuit 70 to perform phase control, and the like, again after the temperature of the semiconductor device 10 has changed, even when phase control and duty control have already been performed (and locked). Therefore, phase control, and the like, is preferably performed again after a suitable amount of time has passed. The oscillator startup signal DLL_OSC_Enable is the startup signal used to start measuring the period until the next phase control operation after phase control has been completed. The measurement of this period is activated when the oscillator circuit in the DLL refresh control circuit 71 has received an oscillator startup signal DLL_OSC_Enable. After a predetermined number of clock signals has been counted, a DLL start signal DLL_START is activated which instructs the DLL refresh control circuit 71 to perform another adjustment. The DLL circuit 70 then performs another phase control operation, and the like, when the DLL start signal DLL_START is received.

The clock output control circuit 73 receives the internal clock signal LCLK, generates an internal clock signal LCLK_OUT1 while switching operating modes in response to the activity states of the internal active command ACT and internal read command READ explained in detail below, and outputs the clock signal to the output node 73a. There are three operating modes including a clock stopping mode in which the internal clock signal LCLK_OUT1 is not outputted and the potential of the output node 73a is fixed at the low level or high level, a long-period clock output mode in which a clock signal with a period longer than the internal clock signal LCLK (long-period clock signal) is generated and outputted as internal clock signal LCLK_OUT1, and a normal clock output mode in which the internal clock signal LCLK is outputted as the internal clock signal LCLK_OUT1. The output potential at the output node 73a is supplied via the clock transmission circuit 3 to the FIFO 63, the input/output circuit 64, and the DQS input/output circuit 65.

The clock transmission circuit 3 includes a buffer circuit 75 and a clock tree 76. The buffer circuit 75 includes a plurality of complementary metal oxide semiconductors (CMOS) connected in series, and outputs the internal clock signal LCLK_OUT1 to the FIFO 63 and the clock tree 76. The clock tree 76 distributes the supplied internal clock signal LCLK_OUT1 to the input/output circuit 64 and the DQS input/output circuit 65. The clock tree 76 also includes, for example, a plurality of internal CMOS semiconductors.

The clock output control circuit 74 supplies the internal clock signal LCLK to the replica circuit 72 as internal clock signal LCLK_OUT2 when the DLL ON signal DLL_ON, described below, and/or DLL start signal DLL_START have been activated. When neither one has been activated, the output from the clock output control circuit 74 is controlled so as to remain fixed at the low level or high level.

The replica circuit 72 artificially replicates the clock transmission circuit 3. The internal clock signal LCLK_OUT2 inputted to the replica circuit 72 is subjected to substantially the same delay and waveform change as the internal clock signal LCLK_OUT1 received via the clock transmission circuit 3, and is supplied to the DLL circuit 70.

The internal delay in the semiconductor device 10 is reproduced by the replica circuit 72, this is fed back to the DLL circuit 70, and timing control is performed on the internal clock signal LCLK. In this way, read data can be outputted by the semiconductor device 10 on a timing that is synchronized with the external clock signal CKS.

The command terminal 12 receives command signals CMD such as a clock enable signal CKE, a row address strobe signal /RAS, a column address strobe signal /CAS, a write enable signal /WE, a chip select signal /CS, a reset signal /RESET, an active command signal ACT, a read command signal READ, and an idle command signal IDLE. The forward slash prefix [/] added to the command names indicates the inverted signal or low active signal of the corresponding signal.

The command signals CMD supplied to the command terminal 12 are supplied via the command buffer 31 to the command decoder 32. The internal clock enable signal ICKE in which the clock enable signal CKE has been buffered is supplied to the clock buffer 40 and the address buffer 41. Power consumption can be reduced by stopping operation of the clock buffer 40 and the address buffer 41 when the clock enable signal CKE is inactive (that is, the internal clock enable signal ICKE is inactive) during so-called power down mode. When active, buffering operations are performed on the clock buffer 40 and the address buffer 41.

The command decoder 32 receives the command signals CMD from the command buffer 31, holds the command signals CMD, and generates internal commands by performing decoding and counting operations. These internal commands include commands related to memory cell reading and writing operations such as the internal active command ACT, internal idle command IDLE, internal read command READ, and internal write command WRITE, as well as the DLL enable command DLL Enable which activates and deactivates the DLL circuit 70, and the self-refresh command Self Enable which starts and stops the self-refresh operation on the memory array 60.

The internal commands generated by the command decoder 32 are supplied to the various circuits of the semiconductor device 10. More specifically, the internal active command ACT is supplied to the row control circuit 51, the internal active command ACT, the internal read command READ, and the internal idle command IDLE are supplied to the clock output control circuit 73, the internal read command READ is supplied to the column control circuit 52, and the DLL enable command DLL Enable and the self-refresh command Self Enable are supplied to the DLL refresh control circuit 71.

The address terminal 13 receives address signals ADD with n+1 address bits A0-An, the supplied address signals ADD are buffered by the address buffer 41, and the row addresses are supplied and latched by the row control circuit 51 and the column addresses are supplied and latched by the column control circuit 52.

The row control circuit 51 selects a word line WL in the memory cell array 60 on the basis of the row address supplied by the address buffer 41. The memory cell array 60 includes a plurality of intersecting word lines WL and bit lines BL, and memory cells MC are located at the intersections. (FIG. 5 only shows a single word line WL, a single bit line BL, and a single memory cell MC.) The bit lines BL are connected to the corresponding sense amplifier SA in the sense circuit 61.

The column control circuit 52 selects a sense amplifier SA in the sense circuit 61. The sense amplifier SA selected by the column control circuit 52 is connected to the read/write amplifier (RWAMP) 62 via the main I/O line MIO.

During a read operation, the read data DQ amplified by a sense amplifier SA is further amplified by the read/write amplifier 62, and outputted via the FIFO 63 and input/output circuit 64 and from the data input/output terminal 14 to an external unit. During a write operation, write data DQ inputted from the outside via the data input/output terminal 14 is inputted, in turn, via the input/output circuit 64 and the FIFO 63 in sequential order to the read/write amplifier 62, and the amplified write data is supplied to a sense amplifier SA.

The data input/output terminal 14 is used to output read data DQ and to input write data DQ. The semiconductor device 10 includes m+1 (m≥0) data input/output terminals 14, and is able to simultaneously input or output m+1 bits of data.

A FIFO 63 is a first-in/first-out circuit used to queue read data DQ and write data DQ, and is provided for each data input/output terminal 14. The following explanation focuses on the read operation. Here, read data DQ outputted from the read/write amplifier 62 is allocated to each data input/output terminal 14 using multiplexing (not shown), and queued in the corresponding FIFO 63. The FIFO 63 then outputs the queued read data DQ to the input/output circuit 64 on timing synchronized with the internal clock signal LCLK.

An input/output circuit 64 has an output circuit and an input circuit for each data input/output terminal 14. The following explanation focuses on the read operation. Here, the output buffer shapes the read data DQ outputted from the corresponding FIFO 63, and outputs the read data from the corresponding data input/output terminal 14 to the external unit on timing synchronized with the internal clock signal LCLK_OUT1.

The data strobe terminal 15 inputs and outputs data strobe signals DQS used as reference for data input and output operations between the DQS input/output circuit 65 and an external controller. The DQS input/output circuit 65 has an output circuit and an input circuit for each data input/output terminal 14.

During a write operation, a data strobe signal DQS is inputted from an external unit to the DQS input/output circuit 65 via the data strobe terminal 15. The DQS input/output circuit 65 controls the timing by which the input/output circuit 64 incorporates write data DQ from the data input/output terminal 14 on the basis of the inputted data strobe signal DQS.

During a read operation, a data strobe data signal DQS_DATA is supplied to the DQS input/output circuit 65 from an internal unit of the semiconductor device 10. The DQS input/output circuit 65 is synchronized with the internal clock signal LCLK_OUT1 supplied from the clock tree 76, and outputs a data strobe data signal DQS_DATA to the data strobe terminal 15. The external controller, synchronized with the outputted data strobe data signal DQS_DATA, incorporates read data DQ outputted from the input/output terminal 14. In other words, the DLL circuit 70 controls the internal clock signal LCLK so that the data strobe data signal DQS_DATA is synchronized with the external clock signal CKS.

The DLL refresh control circuit 71 controls the timing on which the self-refresh of the memory cell array 60 is performed and the timing on which the DLL circuit 70 is started. The self-refresh control timing and the DLL circuit 70 startup timing both use a shared circuit because use of a shared oscillator circuit in the DLL refresh control circuit 71 saves space. However, a shared circuit does not have to be used. Dedicated oscillator circuits for self-refresh and DLL control can also be installed. In addition to the DLL enable command DLL Enable, self-refresh command Self Enable, and oscillator startup signal DLL_OSC_Enable mentioned above, data indicating the self-refresh interval Self_Timing and data indicating the periodic startup interval of the DLL circuit 70 are also supplied to the DLL refresh control circuit 71 from the ROM 77. This data is written to the ROM 77 at the time of manufacture.

The DLL refresh control circuit 71, first in relation to the DLL circuit 70, activates the DLL ON signal DLL_ON indicating the DLL start period when an inputted DLL enable command DLL Enable has been activated. If not, the DLL ON signal DLL_ON is not activated. The DLL ON signal DLL_ON is supplied to the DLL circuit 70, the clock output control circuit 74, and the replica circuit 72. When the DLL ON signal DLL_ON has been activated, the DLL circuit 70 performs phase control and duty control on the internal clock signal LCLK, and generates an adjusted internal clock signal LCLK. This is referred to as the initial adjustment. After the initial adjustment (that, is after the DLL circuit has been locked), the DLL circuit 70 activates the oscillator startup signal DLL_OSC_Enable.

Next, when the inputted oscillator startup signal DLL_OSC_Enable has been activated, the DLL refresh control circuit 71 activates the DLL start signal DLL_START indicating the update period for the DLL circuit 70, periodically, using the interval indicated by data DLL_Timing. The DLL start signal DLL_START is activated after the oscillator startup signal DLL_OSC_Enable has been inputted to the oscillator circuit (not shown) in the DLL refresh control circuit 71, the clock signal has been oscillated, and a predetermined number of clock signals have been counted. The DLL start signal DLL_START is used to adjust the internal clock signal LCLK two or more times in the DLL circuit 70. In this way, the DLL circuit 70 is able to generate an internal clock signal LCLK inside the semiconductor device 10 so that the internal clock signal LCLK is periodically adjusted and the output timing of the read data can be synchronized with the timing of, for example, the external clock.

As for the self-refresh, when the self-refresh command Self Enable is activated, the DLL refresh control circuit 71 periodically generates a self-refresh start signal SREF_START at the interval indicated by the data Self_Timing, and the start signal is outputted to the refresh circuit (REF) 53. This activates the self-refresh start signal SREF_START or controls the oscillation described above. The refresh circuit 53 outputs row addresses in a predetermined order. When the self-refresh start signal SREF_START is received, the refresh circuit 53 outputs the row address following the previously outputted row address to the row control circuit 51. When this process is repeated, all row addresses are eventually self-refreshed.

FIG. 6 is a block diagram showing, as an example, the configuration of the DLL circuit 70 according to the present embodiment. Referring to FIG. 6, the DLL circuit 70 includes a granularity changing circuit 16, a control circuit 17, a counter circuit 18, a decoder circuit 19, a variable delay circuit 22, a phase determining circuit 24, a variable divider circuit 26, and a detection circuit 28.

The DLL circuit 70 delays the input clock signal CK by the desired phase (target phase) to generate an output clock signal CKOUT, and the generated output clock signal CKOUT is outputted.

The variable divider circuit 26 divides the input clock signal CK by a variable division ratio, and generates divided clock signals CK1, CK2, and CK2C having different phases. Divided clock signal CK1 has a phase in advance of divided clock signals CK2 and CK2C. Divided clock signals CK2 and CK2C have the same phase in the default state except for the situations described below. In FIG. 6, as an example, the variable divider circuit 26 outputs three divided clock signals CK1, CK2 and CK2C. However, the variable divider circuit 26 may output any other number of divided clock signals.

The counter circuit 18 generates a count value determining the amount of signal delay for the variable delay circuit 22, and a count signal CNT indicating the count value is outputted to the decoder circuit 19.

The decoder circuit 19 decodes the count signal CNT received from the counter circuit 18, and outputs the signal to the variable delay circuit 22.

The variable delay circuit 22 delays the input clock signal CK by the amount of delay determined in response to the count signal CNT, and generates an output clock signal CKOUT.

The phase determining circuit 24 determines whether or not the phase difference of the input clock signal CK and the output clock signal CKOUT is greater than the desired target phase, and outputs the determination result as a phase determining signal to the control circuit 17.

The control circuit 17, synchronized with divided clock signal CK1, references the phase determining signal, and generates an up/down signal UPDN indicating whether or not the phase difference of the input clock signal CK and the output clock signal CKOUT is greater than the desired target phase. When the phase difference of the input clock signal CK and the output clock signal CKOUT is greater than the desired target phase, the control circuit 17 outputs a low-level up/down signal UPDN. When the phase difference of the input clock signal CK and the output clock signal CKOUT is smaller than the desired target phase, the control circuit 17 outputs a high-level up/down signal UPDN.

The detection circuit 28 detects whether or not the up/down signal UPDN outputted by the control circuit 17 has changed before and after the count value was changed by the counter circuit 18 (that is, before and after the variable delay circuit 22 changed the amount of delay). When the up/down signal UPDN changed before and after the count value was changed, a high-level target edge detection signal TE is outputted. If not, a low-level target edge detection signal TE is outputted.

The granularity changing circuit 16, synchronized with divided clock signal CK2, references the target edge detection signal TE. When the target edge detection signal TE is a high-level signal, the count width when the counter circuit 18 updates the count value (increment or decrement) is changed from large to small, and a granularity indicating signal indicating the count width is outputted.

When the variable divider circuit 26 detects a transition in the target edge detection signal TE from low level to high level, the division ratio of the divided clock signal CK2C is increased so as to be larger than the division ratio of divided clock signals CK1 and CK2 in the clock period. The variable divider circuit 26 also sets the division ratios of divided clock signals CK1 and CK2 to be greater than the division ratio of divided clock signal CK2C in the clock period following the aforementioned clock period.

The counter circuit 18, synchronized with the divided clock signal CK2C, references the up/down signal UPDN and the granularity indicating signal and, when the up/down signal UPDN is a high-level signal, increments the count value by the count width indicated by the granularity indicating signal. When the up/down signal UPDN is a low-level signal, the counter circuit 18 decrements the count value by the count width indicated by the granularity indicating signal.

FIG. 7 is a timing chart showing, as an example, the operations of the DLL circuit 70 (FIG. 6) according to the present embodiment. In FIG. 7, as an example, the division ratio for the divided clock signals CK1, CK2, and CK2C generated by the variable divider circuit 26 in the default state is 4.

Referring to FIG. 7, the control circuit 17, synchronized with the rising edge of time t1 for divided clock signal CK1, references the phase determining signal outputted by the phase determining circuit 24. Because the output phase of the DLL circuit 70 (that is, the phase difference between the input clock signal CK and the output clock signal CKOUT) is greater than the target phase, a low-level up/down signal UPDN is outputted.

At time t1, the detection circuit 28 detects the change in the up/down signal UPDN outputted by the control circuit 17 before and after the counter circuit 18 updates the count value, and outputs a high-level target edge detection signal TE.

The granularity changing circuit 16, synchronized with the rising edge of time t2 for divided clock signal CK2, references the target edge detection signal TE outputted from the detection circuit 28. Because the target edge detection signal TE is a high-level signal, the count width when the counter circuit 18 changes the count value is changed from 16 to 4, and a granularity indicating signal is outputted indicating that the count width after the change is 4.

When the variable divider circuit 26 detects the transition of the target edge detection signal TE from a low-level signal to a high-level signal at time t1, the division ratio for divided clock signal CK2C is set to 5 for the clock period, which is greater than the division ratio for divided clock signals CK1 and CK2 of 4. The variable divider circuit 26 also sets the division ratio for divided clock signals CK1 and CK2 to 5, which is greater than the division ratio for divided clock signal CK2C of 4, for the clock period following the aforementioned clock period.

The counter circuit 18, synchronized with the rising edge of time t3 for divided clock signal CK2C, references the up/down signal UPDN and the granularity indicating signal. Because the up/down signal UPDN is a low-level signal and because the granularity indicating signal indicates a count width of 4, the counter circuit 18 decrements the count value by a count width of 4.

This process is repeated, the phase difference between the input clock signal CK and the output clock signal CKOUT is eventually adjusted to the minimum count width of 1, and the circuit enters the locked state.

In the example shown in FIG. 7, the locked state is reached in a period including three periods in which the divided clock signals have a division ratio of 4 and two periods in which the divided clock signals have a division ratio of 6. In other words, the time required to reach the locked state (the lock time) corresponds to 22 periods of the input clock signal CK.

In the DLL circuit 70 according to the present embodiment, when the detection circuit 28 has detected that the phase difference of the output clock signal CKOUT and the input clock signal CK crosses the target phase (that is, the size relationship has reversed), the detection circuit 28 generates a high-level target edge detection signal TE. The variable divider circuit 26 is a divider circuit which is able to change the division ratio if necessary. The target edge detection signal TE outputted by the detection circuit 28 is connected to the variable divider circuit 26. Usually, when a size relationship reversal has not been detected, the variable divider circuit 26 generates a divided clock signal with a period that is an n-multiple of the input clock signal CLK (division ratio n being division ratio 4 in the example shown in FIG. 7).

When the locking operation has been started by the DLL circuit 70, the counter circuit 18 has adjusted the count value, and a size relationship reversal has occurred, the detection circuit 28 generates a high-level target edge detection signal TE. When the target edge detection signal TE has transitioned from a low-level signal to a high-level signal, the variable divider circuit 26 delays the divided clock signal CK2C by the desired period (one period of the input clock signal CK in FIG. 7) to ensure setup time tCR. When divided clock signal CK2C has been delayed, the change by the variable delay circuit 22 is delayed, and the feedback delay is also extended. Here, the next divided clock signal CK1 is also delayed by the setup time tCR. As a result, the divided cycle is delayed only during target edge detection.

Therefore, the DLL circuit 70 according to the present embodiment is able to shorten the lock time, regardless of any change in the count width, compared to the DLL circuit in Study Example 1 (FIG. 1) which has a divided period including a setup time tCR, and the DLL circuit in Study Example 2 (FIG. 3) which assigns a period of the divided clock as the setup time tCR for count width updates.

In other words, the DLL circuit 70 according to the present embodiment is a DLL circuit which locks while changing the counter granularity. By increasing the division ratio only for counter granularity changes, the overhead can be reduced during counter granularity changes and the time required for a phase lock of the DLL circuit can be reduced significantly compared to a situation in which controls are performed using divided clock signals to which counter granularity change time tCR is always added (Study Example 1) and to a situation in which a single period is assigned to the divided clock signals for the setup time tCR (Study Example 2).

FIG. 8 is a table showing the performance of the DLL circuits in Study Example 1 and Study Example 2, and the performance of DLL circuit 70 according to the present embodiment.

Adjustments by the variable delay circuit are performed using an 11-bit counter, and the count width (granularity) is changed as shown in FIG. 8. The division ratio for the divided clock signals of the DLL circuit (FIG. 1) in Study Example 1 was 10, and the division ratio for the divided clock signals of the DLL circuit (FIG. 3) in Study Example 2 was 8. The division ratio for the divided clock signals of the DLL circuit 70 in the present embodiment was 8 as the default, and the division ratio when the division ratio was changed and increased was 10. In other words, the setup time (count width changing time) tCR took two periods of the input clock signal CK.

Under these conditions, when the count width was 64, the number of count value updates was 32. The number of count value updates was four when the count width was 16, 4, and 1. At this time, the total number of count value updates was 44 (=32+4+4+4). Also, the number of count width changes was 3 (64→16, 16→4, 4→1).

The time required for the DLL circuit in Study Example 1 to reach the locked state was 440 periods of the input clock signal CK (=division ratio 10×44). Also, the time required for the DLL circuit in Study Example 2 to reach the locked state was 376 periods of the input clock signal CK (=division ratio 8×44+division ratio 8×3). In contrast, the time required for the DLL circuit 70 in the present embodiment to reach the locked state was 358 periods of the input clock signal CK (=division ratio 8×41+division ratio 10×3).

Therefore, in the situation shown in the table in FIG. 8, the DLL circuit 70 of the present embodiment requires 19% (=(440−358)/440) less time for a phase lock than the DLL circuit in Study Example 1, and 5% (=(376−358)/376) less time than the DLL circuit in Study Example 2.

The reduction in the number of lock cycles for the DLL circuit 70 in the present embodiment relative to the DLL circuits of Study Examples 1 and 2 can be represented approximately using the following equations.

Reduction relative to DLL circuit in Study Example 1=*tCR* (number of cycles)/division ratio;

reduction relative to DLL circuit in Study Example 2=number of count width changes/total number of count updates Therefore, in the DLL circuit 70 according to the present embodiment, the reduction rate increases relative to the DLL circuit in Study Example 1 as the setup time tCR increases, while the reduction rate increases relative to the DLL circuit in Study Example 2 as the number of count width switches increases.

Each disclosure in the patent documents mentioned above is incorporated herein by reference. Modifications and adjustments are possible within the bounds of the entire disclosure of the present invention (including the claims) and on the basis of the basic technical concepts therein. Also, the various disclosed elements within the scope of the claims of the present invention (including each element of each claim, each element of each embodiment, and each element of each drawing) can be freely combined and selected. In other words, the present invention includes all variations and modifications that a person skilled in the art could devise on the basis of all of the disclosures and technical concepts included in the claims. The numerical ranges described herein should be understood to include any particular number or a small range therein even when not otherwise stated.

KEY TO THE DRAWINGS

3: Clock transmission circuit
10: Semiconductor device
11: Clock terminal
12: Command terminal
13: Address terminal
14: Data input/output terminal
15: Data strobe terminal
16, 116: Granularity changing circuit
17, 117: Control circuit
18, 118: Counter circuit
19, 119: Decoder circuit
22, 122: Variable delay circuit
24, 124: Phase determining circuit
26: Variable divider circuit
28, 128: Detection circuit
31: Command buffer
32: Command decoder
40: Clock buffer
41: Address buffer
51: Row control circuit
52: Column control circuit
53: Refresh circuit (REF)
60: Memory cell array
61: Sense circuit
62: Read-write amplifier (RWAMP)
63: FIFO
64: Input/output circuit
65: DQS input/output circuit
70: DLL circuit
71: DLL refresh control circuit
72: Replica circuit
73, 74: Clock output control circuit
73a: Output node
75: Buffer circuit
76: Clock tree
77: ROM
126: Divider circuit
ACT: Active command signal, internal active command
ADD: Address signal
BL: Bit line
/CAS: Column address strobe signal
CK: Input clock signal
CK1-CK3, CK2C: Divided clock signal
CKE: Clock enable signal
CKOUT: Output clock signal
CKS: External clock signal
CMD: Command signal
CNT: Count signal
/CS: Chip select signal
DLL Enable: DLL enable command
DLL_ON: DLL ON signal
DLL_OSC_Enable: Oscillator startup signal
DLL_START: DLL start signal
DQS: Data strobe signal
DQS_DATA: Data strobe data signal
ICKE: Internal clock enable signal
ICLK: Internal clock signal
IDLE: Idle command signal, internal idle command
LCLK, LCLK_OUT1, LCLK_OUT2: Internal clock signal
MC: Memory cell
MIO: Main I/O line
/RAS: Row address strobe signal
READ: Read command, internal read command
/RESET: Reset signal
SA: Sense amplifier
Self Enable: Self-refresh command
SREF_START: Self-refresh start signal
TE: Target edge detection signal
UPDN: Up/down signal
/WE: Write enable signal
WL: Word line
WRITE: Internal write command

What is claimed is:

1. A delay locked loop (DLL) circuit comprising:
a variable divider circuit for generating a first divided clock signal and a second divided clock signal by dividing a first clock signal using a variable division ratio;
a granularity changing circuit synchronized with the first divided clock signal for changing the count width;
a counter circuit synchronized with the second divided clock signal for updating the count value in response to the count width; and
a variable delay circuit for delaying the first clock signal on the basis of the amount of delay in response to the count value to generate a second clock signal;
wherein the granularity changing circuit is configured to change the count width and the variable divider circuit is configured to establish a division ratio for the second divided clock signal greater than the division ratio for the first divided clock signal when the size relationship between the phase difference of the first clock signal and the second clock signal and a predetermined value has been reversed before and after an update of the count value.

2. The DLL circuit as claimed in claim 1, wherein the variable divider circuit is configured to establish a division ratio for the first divided clock signal greater than the division ratio for the second divided clock signal after the division ratio for the second divided clock signal has been established to be greater than the division ratio for the first divided clock signal.

3. The DLL circuit as claimed in claim 2, wherein the variable divider circuit is configured to divide the first clock signal by the same division ratio to generate a first divided clock signal and a second divided clock signal having no phase difference, the division ratio of the second divided clock signal being established so as to be greater than the division ratio of the first divided clock signal in a divided clock period in which the size relationship has been reversed before and after an update of the count value, and the division ratio of the first clock signal being established so as to be greater than the division ratio of the second divided clock signal in the divided clock period following this divided clock period.

4. The DLL circuit as claimed in claim 3, wherein the variable divider circuit is configured to divide the first clock signal by the same division ratio to generate a third divided clock signal having a phase in advance of the first divided clock signal and the second divided clock signal.

5. The DLL circuit as claimed in claim 4 further comprising a control circuit synchronized with the third divided clock signal for referencing the determination results of the phase determining circuit and generating an up/down signal indicating the size relationship between the phase difference and the predetermined value, wherein the counter circuit is configured to increment the count value by the count width when a phase difference smaller than the predetermined value is indicated by the up/down signal, and decrement the count value by the count width when a phase difference larger than the predetermined value is indicated by the up/down signal.

6. The DLL circuit as claimed in claim 4, wherein the variable divider circuit is configured to establish the division ratio of the second divided clock signal so as to be greater than the division ratio of the first divided clock signal and the third divided clock signal in the divided clock period in which the size relationship has been reversed before and after an update of the count value, and establish the division ratio of the first divided clock signal and the division ratio of the third divided clock signal so as to be greater than the division ratio of the second divided clock signal in the divided clock period following this divided clock period.

7. The DLL circuit as claimed in claim 1, comprising a phase determining circuit for determining whether or not the phase difference between the first clock signal and the second clock signal is greater than a predetermined value.

8. The DLL circuit as claimed in claim 7 comprising a detection circuit for detecting, on the basis of the determination results of the phase determining circuit, a reversal in the size difference between the predetermined value and the phase difference before and after the counter circuit has updated the count value, and notifying the variable divider circuit and the granularity changing circuit of the detection results.

9. A semiconductor device comprising:
a DLL circuit for receiving an external clock signal as the first clock signal, and generating an internal clock signal synchronized with the external clock signal as the second clock signal, the DLL circuit comprising:
a variable divider circuit for generating a first divided clock signal and a second divided clock signal by dividing a first clock signal using a variable division ratio;
a granularity changing circuit synchronized with the first divided clock signal for changing the count width;
a counter circuit synchronized with the second divided clock signal for updating the count value in response to the count width; and
a variable delay circuit for delaying the first clock signal on the basis of the amount of delay in response to the count value to generate a second clock signal;
wherein the granularity changing circuit is configured to change the count width and the variable divider circuit is configured to establish a division ratio for the second divided clock signal greater than the division ratio for the first divided clock signal when the size relationship between the phase difference of the first clock signal and the second clock signal and a predetermined value has been reversed before and after an update of the count value;
a memory cell for storing output data; and
an output buffer for synchronizing the output data with the internal clock signal and outputting the synchronized output data to an external unit.

10. The semiconductor device as claimed in claim 9, wherein the variable divider circuit is configured to establish a division ratio for the first divided clock signal greater than the division ratio for the second divided clock signal after the division ratio for the second divided clock signal has been established to be greater than the division ratio for the first divided clock signal.

11. The semiconductor device as claimed in claim 10, wherein the variable divider circuit is configured to divide the first clock signal by the same division ratio to generate a first divided clock signal and a second divided clock signal having no phase difference, the division ratio of the second divided clock signal being established so as to be greater than the division ratio of the first divided clock signal in a divided clock period in which the size relationship has been reversed before and after an update of the count value, and the division ratio of the first clock signal being established so as to be greater than the division ratio of the second divided clock signal in the divided clock period following this divided clock period.

12. The semiconductor device as claimed in claim 11, wherein the variable divider circuit is configured to divide the first clock signal by the same division ratio to generate a third divided clock signal having a phase in advance of the first divided clock signal and the second divided clock signal.

13. The semiconductor device as claimed in claim 12, wherein the DLL circuit further comprises:
a control circuit synchronized with the third divided clock signal for referencing the determination results of the phase determining circuit and generating an up/down signal indicating the size relationship between the phase difference and the predetermined value,
wherein the counter circuit is configured to increment the count value by the count width when a phase difference smaller than the predetermined value is indicated by the up/down signal, and decrement the count value by the count width when a phase difference larger than the predetermined value is indicated by the up/down signal.

14. The semiconductor device as claimed in claim 9, wherein the DLL circuit further comprises a phase determining circuit for determining whether or not the phase difference between the first clock signal and the second clock signal is greater than a predetermined value.

15. The semiconductor device as claimed in claim 9, wherein the DLL circuit further comprises a detection circuit for detecting, on the basis of the determination results of the phase determining circuit, a reversal in the size difference between the predetermined value and the phase difference before and after the counter circuit has updated the count value, and notifying the variable divider circuit and the granularity changing circuit of the detection results.

* * * * *